United States Patent
Bowers et al.

(10) Patent No.: US 10,658,995 B1
(45) Date of Patent: May 19, 2020

(54) CALIBRATION OF BONE CONDUCTION TRANSDUCER ASSEMBLY

(71) Applicant: Facebook Technologies, LLC, Menlo Park, CA (US)

(72) Inventors: Peter Bowers, Redmond, WA (US); Morteza Khaleghimeybodi, Bellevue, WA (US); Peter Gottlieb, Seattle, WA (US); Antonio John Miller, Woodinville, WA (US); Jack Yahkub Dagdagan, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/248,674

(22) Filed: Jan. 15, 2019

(51) Int. Cl.
*H04R 1/10* (2006.01)
*H03G 5/16* (2006.01)
(Continued)

(52) U.S. Cl.
CPC ............ *H03G 5/165* (2013.01); *H04R 1/1008* (2013.01); *H04R 1/1041* (2013.01); *H04R 3/04* (2013.01);
(Continued)

(58) Field of Classification Search
CPC ............ H03G 5/00; H03G 5/005; H03G 5/02; H03G 5/025; H03G 5/16; H03G 5/165; H04R 1/10; H04R 1/1008; H04R 1/1016; H04R 1/1083; H04R 1/1091; H04R 1/1041; H04R 5/033; H04R 3/04; H04R 3/06; H04R 3/08; H04R 3/12; H04R 3/14; H04R 23/00; H04R 23/02; H04R 23/30;
(Continued)

(56) References Cited

U.S. PATENT DOCUMENTS

| 1,983,178 A | 12/1934 | Lybarger |
| 5,867,582 A | 2/1999 | Nagayoshi |

(Continued)

FOREIGN PATENT DOCUMENTS

| EP | 3445066 A1 | 2/2019 |
| KR | 2016/0111280 A | 9/2016 |

OTHER PUBLICATIONS

United States Office Action, U.S. Appl. No. 15/967,924, dated Jun. 27, 2019, 12 pages.
(Continued)

*Primary Examiner* — Leshui Zhang
(74) *Attorney, Agent, or Firm* — Fenwick & West LLP

(57) ABSTRACT

Calibration of a headset that uses bone conduction to provide audio content to a wearer is presented. A first tone of a plurality of tones that are at different frequencies is presented to the wearer via an air conduction transducer. A corresponding tone having a same frequency as the first tone is also presented to the wearer via a bone conduction (BC) transducer. The corresponding tone is adjusted such that a level of loudness is within a threshold range of a level of loudness of the first tone. An ear-canal sound pressure (ECSP) resulting from the first tone is recorded and a voltage applied to the BC transducer for generating the adjusted corresponding tone. An equalization filter is generated based in part on the ECSP and the voltage, the equalization filter for filtering an audio signal for presentation via the BC transducer.

18 Claims, 8 Drawing Sheets

(51) Int. Cl.
*H04R 29/00* (2006.01)
*H04R 3/04* (2006.01)
*H04R 23/02* (2006.01)

(52) U.S. Cl.
CPC ........... *H04R 23/02* (2013.01); *H04R 29/001* (2013.01); *H04R 2460/13* (2013.01)

(58) Field of Classification Search
CPC .. H04R 23/305; H04R 23/356; H04R 23/353; H04R 29/00; H04R 29/001; H04R 29/002; H04R 2460/13
USPC ........... 381/55–60, 312–321, 150, 151, 71.1, 381/71.6, 71.7, 71.8, 71.9, 71.11, 71.12, 381/71.14, 72, 73.1, 74, 101, 102, 103, 381/104, 105, 107, 109, 110, 120, 121, 381/122, 111, 116, 117; 700/94
See application file for complete search history.

(56) References Cited

U.S. PATENT DOCUMENTS

| | | | |
|---|---|---|---|
| 8,977,376 B1 * | 3/2015 | Lin | H04R 3/04 700/94 |
| 9,648,438 B1 | 5/2017 | Petrov | |
| 2008/0037801 A1 * | 2/2008 | Alves | G10L 21/02 381/71.6 |
| 2010/0174767 A1 * | 7/2010 | Villemoes | G10L 19/02 708/300 |
| 2011/0301729 A1 | 12/2011 | Heiman et al. | |
| 2013/0051585 A1 | 2/2013 | Karkkainen et al. | |
| 2013/0216052 A1 * | 8/2013 | Bruss | H04R 1/1091 381/59 |
| 2014/0363003 A1 * | 12/2014 | Kupershmidt | H04R 29/00 381/58 |
| 2015/0181338 A1 | 6/2015 | Hiroshi et al. | |
| 2015/0271590 A1 * | 9/2015 | Nakagawa | H04R 1/1091 381/151 |
| 2017/0228995 A1 | 8/2017 | Hosoi et al. | |
| 2018/0227687 A1 * | 8/2018 | Thomson | H04R 29/004 |

OTHER PUBLICATIONS

PCT International Search Review and Written Opinion, PCT Patent Application No. PCT/US2019/026944, dated Jun. 14, 2019, 42 pages.

\* cited by examiner

450

```
Present, via a bone conduction (BC) transducer of a headset, an audio signal to
a wearer of the headset
452
```

```
Monitor sensor data related to at least one variable related to an ear of the
wearer measured upon presenting the audio signal to the wearer via the BC
transducer
454
```

```
Dynamically adjust the audio signal provided to the wearer via the BC
transducer so that the monitored sensor data is within a threshold from an
equalization data for the BC transducer
456
```

CALIBRATION OF BONE CONDUCTION TRANSDUCER ASSEMBLY

BACKGROUND

The present disclosure relates generally to an audio system in an artificial reality headset, and specifically relates to calibration of a bone conduction transducer assembly in the audio system.

Headsets in artificial reality systems often include features such as speakers or personal audio devices to provide audio content to wearers of the headsets. One typical requirement for operating a headset in an artificial reality system is that a wearer's ears remain effectively un-occluded, so that the wearer of the headset can receive acoustic signals from an environment while seamlessly being presented with audio content from the headset. Bone conduction technology can be used to deliver audio content to the wearer of the headset, as a system exploiting this technology would leave the ear canals un-occluded. However, to deliver a high-quality audio experience and to ensure realistic spatial audio via bone conduction, calibration of a bone conduction transducer assembly in the acoustic system is desirable.

SUMMARY

Embodiments of the present disclosure support a method and apparatus for calibration of a headset that uses bone conduction to provide audio content to a wearer of the headset. A first tone of a plurality of tones that are at different frequencies is presented to the wearer via an air conduction transducer assembly. A corresponding tone having a same frequency as the first tone is then presented to the wearer via a bone conduction transducer assembly of the headset. The corresponding tone is adjusted such that a level of loudness is within a threshold range of a level of loudness of the first tone. An ear-canal sound pressure (ECSP) resulting from the first tone is recorded. Additionally, a voltage is recorded that is being applied to the bone conduction transducer assembly for generating the adjusted corresponding tone such that the level of loudness of the adjusted corresponding tone is within the threshold range of the level of loudness of the first tone. An equalization filter is generated based in part on the ECSP and the voltage. The equalization filter can be used for filtering an audio signal for presentation via the bone conduction transducer assembly.

BRIEF DESCRIPTION OF THE DRAWINGS

FIG. 4D is a flowchart illustrating another process for calibration of a headset having an audio system that includes a bone conduction transducer assembly, in accordance with one or more embodiments.

Figure 1:
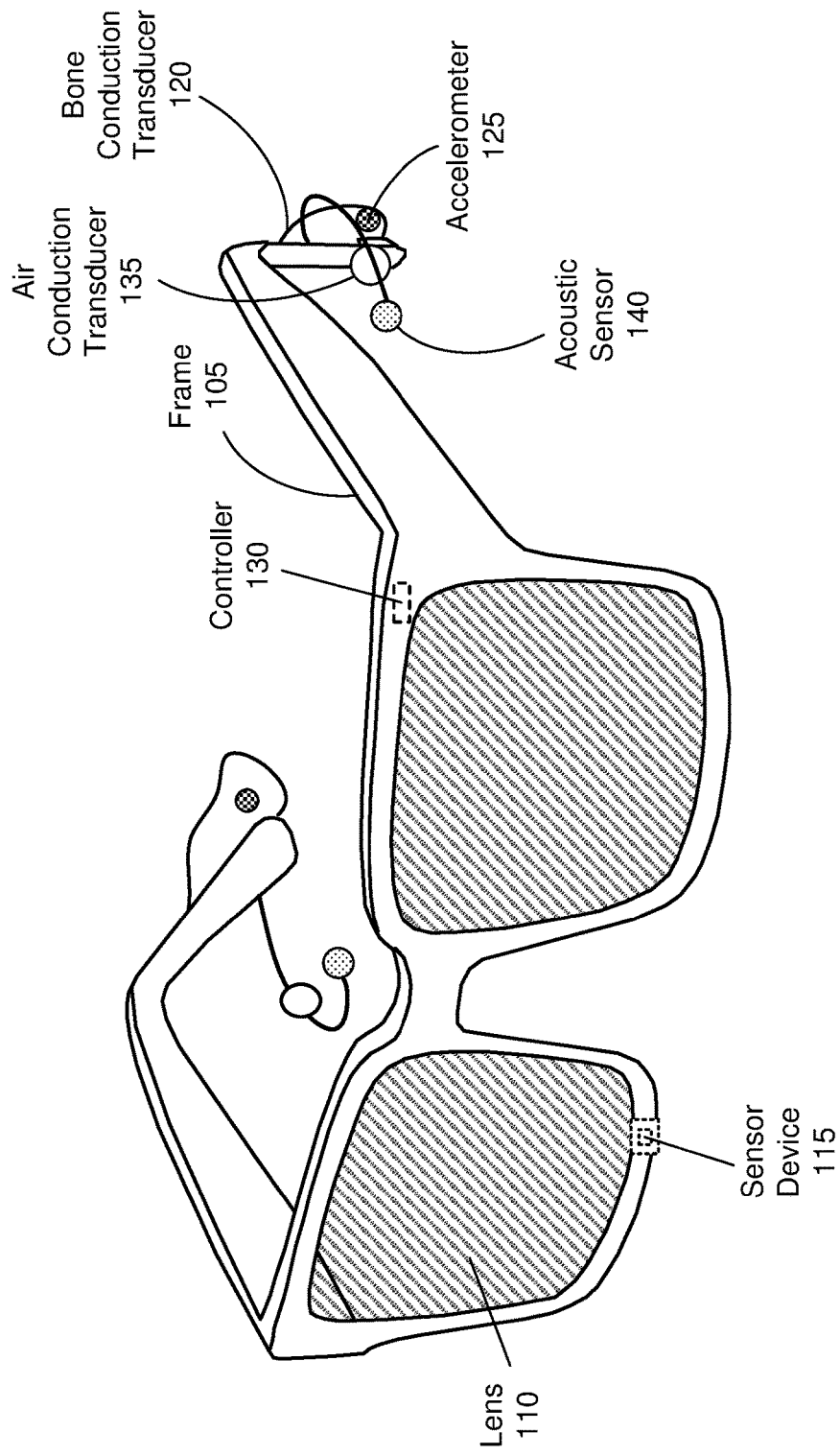
FIG. 1 is a perspective view of a headset including an audio system, in accordance with one or more embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Embodiments of the present disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a headset, a head-mounted display (HMD) connected to a host computer system, a standalone HMD, a near-eye display (NED), a mobile device or computing system, or any other hardware platform capable of providing artificial reality content to one or more viewers.

A calibration method for a headset that uses an audio system with bone conduction to provide audio content to a wearer of the headset. The audio system includes one or more sensors (e.g., a microphone, an accelerometer, and/or a dynamic force sensor), a bone conduction transducer assembly, and a controller. The bone conduction transducer assembly is configured to vibrate a bone in a wearer's head to create an acoustic pressure wave that is conducted by tissue/bone of the head (bypassing the eardrum) to the cochlea. The cochlea turns acoustic pressure wave (e.g., bone-borne or tissue borne) into signals which the brain perceives as sound. In some embodiments, the audio system further includes an air conduction transducer assembly (e.g., a speaker). The air conduction transducer assembly directly creates an airborne acoustic pressure wave at the entrance of the wearer's ear which also travels to the eardrum that vibrates the eardrum. These vibrations are turned into signals by the cochlea (also referred to as the inner ear) which the brain perceives as sound.

In some embodiments, the audio system is calibrated using an equal loudness method where various tones at different frequencies are presented via the air conduction transducer assembly and corresponding tones are presented at the same frequencies via the bone conduction transducer assembly. Each tone presented via the air conduction transducer assembly represents an audio signal having a unique frequency among the different frequencies. Each corresponding tone presented via the bone conduction transducer assembly represents a corresponding audio signal having the same unique frequency. The audio system adjusts each tone presented via the bone conduction transducer assembly until the wearer's perception of loudness of each adjusted tone is the same as for each corresponding tone presented via the air conduction transducer assembly. The audio system also records a voltage applied to the bone conduction transducer assembly for generating each adjusted tone. The audio system generates an equalization curve using the recorded voltages. The equalization curve is used to calibrate the bone conduction transducer assembly to the wearer.

Note that a resolution of the tones presented for calibration of the bone conduction transducer assembly can be different for coarse and fine calibration procedures. For the coarse calibration procedure, a frequency of each presented tone may be at a corresponding octave band. For the fine calibration procedure, a frequency of each presented tone may be at a corresponding one-third of each octave band. For example, center frequencies for octave bands are: 16 Hz, 31.5 Hz, 63 Hz, 125 Hz, 250 Hz, 500 Hz, 1000 Hz, 2000 Hz, 4000 Hz, 8000 Hz, and 16000 Hz.

In alternative embodiments, a series of narrow-band noise signals centered around a small range of target frequencies can be used for calibration of the bone conduction transducer assembly. A narrow-band noise signal centered at each target frequency may be first presented via the air conduction transducer assembly. Then, a corresponding narrow-band noise signal centered around the same target frequency is presented via the bone conduction transducer assembly. A level of the corresponding narrow-band noise signal (e.g., its magnitude) may be accordingly adjusted until the narrow-band noise signal and the corresponding narrow-band noise signal are perceived as equally loud.

The audio system may further record acceleration data (or dynamic force) associated with vibration of bones for a plurality of wearers of the headset, e.g., during the equal loudness calibration method. The audio system may generate an equalization curve for the bone conduction transducer assembly, based on target equalization curves generated using information from a set of wearers. For example, the set of wearers may be chosen based on similarities with the wearer. In some embodiments, the audio system is calibrated using a method based on the equalization curve for the bone conduction transducer assembly. The audio system may present audio content to a wearer of the headset while monitoring sensor information (e.g., the acceleration data or dynamic force data) acquired by an accelerometer coupled to the bone conduction transducer assembly. The audio system may dynamically adjust audio content to the bone conduction transducer assembly to move the measured acceleration data towards that of the equalization curve.

The headset may be, e.g., a NED, HMD, or some other type of headset. The headset may be part of an artificial reality system. The headset further includes a display and an optical assembly. The display of the headset is configured to emit image light. The optical assembly of the headset is configured to direct the image light to an eye box of the headset corresponding to a location of a wearer's eye. In some embodiments, the image light may include depth information for a local area surrounding the headset.

FIG. 1 is a perspective view of a headset 100 including an audio system, in accordance with one or more embodiments. The headset 100 presents media to a user, i.e., a wearer of the headset 100. In some embodiments (as shown in FIG. 1), the headset 100 is implemented as a NED. Examples of media presented by the headset 100 include one or more images, video, audio, or some combination thereof. The headset 100 may include, among other components, a frame 105, a lens 110, a sensor device 115, and an audio system. The audio system integrated into the headset 100 comprises a bone conduction transducer 120, an accelerometer 125 coupled to the bone conduction transducer 120, a controller 130, an optional air conduction transducer 135, and an optional acoustic sensor 140. In some embodiments (not shown in FIG. 1), one or more additional or alternative components are coupled to the bone conduction transducer 120, e.g., a force sensor, a binaural microphone, etc. The headset 100 shown in FIG. 1 is only an example of an artificial reality system. In alternate embodiments (not shown in FIG. 1), the headset 100 is implemented as an HMD.

The headset 100 may correct or enhance the vision of a wearer, protect the eye of a wearer, or provide images to a wearer. The headset 100 may be eyeglasses which correct for defects in a wearer's eyesight. The headset 100 may be sunglasses which protect a wearer's eye from the sun. The headset 100 may be safety glasses which protect a wearer's eye from impact. The headset 100 may be a night vision device or infrared goggles to enhance a wearer's vision at night. The headset 100 may be a NED or HMD that produces artificial reality content for the wearer. Alternatively, the headset 100 may not include a lens 110 and may be a frame 105 with an audio system that provides audio (e.g., music, radio, podcasts) to a wearer.

The frame 105 includes a front part that holds the lens 110 and end pieces to attach to a head of the wearer. The front part of the frame 105 bridges the top of a nose of the wearer. The end pieces (e.g., temples) are portions of the frame 105 to which the temples of a wearer are attached. The length of the end piece may be adjustable (e.g., adjustable temple length) to fit different wearer. The end piece may also include a portion that curls behind the ear of the wearer (e.g., temple tip, ear piece).

The lens 110 provides or transmits light to the wearer of the headset 100. The lens 110 is held by a front part of the frame 105 of the headset 100. The lens 110 may be prescription lens (e.g., single vision, bifocal and trifocal, or progressive) to help correct for defects in a wearer's eyesight. The prescription lens transmits ambient light to the wearer of the headset 100. The transmitted ambient light may be altered by the prescription lens to correct for defects in the wearer's eyesight. The lens 110 may be a polarized lens or a tinted lens to protect the wearer's eyes from the sun. The lens 110 may be one or more waveguides as part of a waveguide display in which image light is coupled through an end or edge of the waveguide to the eye of the wearer. The lens 110 may include an electronic display for providing image light and may also include an optics block for magnifying image light from the electronic display. Additional details regarding the lens 110 can be found in the detailed description of FIG. 5.

The sensor device 115 estimates a current position of the headset 100 relative to an initial position of the headset 100. The sensor device 115 may be located on a portion of the frame 105 of the headset 100. The sensor device 115 includes a position sensor and an inertial measurement unit. Additional details about the sensor device 115 can be found in the detailed description of FIG. 5.

The audio system of the headset 100 comprises one or more transducer assemblies configured to provide audio content to a wearer of the headset 100. In the illustrated embodiment of FIG. 1, the audio system of the headset 100 includes the bone conduction transducer 120, the accelerometer 125 coupled to the bone conduction transducer 120, and the controller 130. The audio system may further include the air conduction transducer 135 and the acoustic sensor 140. The audio system provides audio content to a wearer via the bone conduction transducer 120. The audio system may use acceleration data associated with vibration of wearer's bones acquired by the accelerometer 125 to calibrate the bone conduction transducer 120. The audio system may also use the air conduction transducer 135 and the acoustic sensor 140 to calibrate the bone conduction transducer 120. The controller 130 manages operation of the transducer assemblies by generating audio instructions. The controller 130 may receive the sensor data monitored by the accelerometer 125, e.g., for calibrating the bone conduction transducer 120. The controller 130 may also receive acoustic data measured by the acoustic sensor 140, e.g., for calibrating the bone conduction transducer 120. Additional details regarding the audio system of the headset 100 are provided in conjunction with FIG. 3 and FIGS. 4A-4D.

The bone conduction transducer 120 produces sound by vibrating bone in the wearer's head. The bone conduction transducer 120 is coupled to an end piece of the frame 105 and is configured to be behind the auricle coupled to a portion of the wearer's bone. The bone conduction transducer 120 also receives audio instructions from the controller 130. The bone conduction transducer 120 vibrates the portion of the wearer's bone which generates a tissue-borne acoustic pressure wave that propagates toward the wearer's cochlea, thereby bypassing the eardrum. The bone conduction transducer 120 may include one or more transducers to cover different parts of a frequency range. For example, a piezoelectric transducer may be used to cover a first part of a frequency range and a moving coil transducer may be used to cover a second part of a frequency range. The audio system of the headset 100 may include one bone conduction transducer 120 for each wearer's ear. Additional details regarding the bone conduction transducer 120 are provided in conjunction with FIG. 3 and FIGS. 4A-4D.

The accelerometer 125 may be coupled to the bone conduction transducer assembly 120. The accelerometer 125 may be configured to measure acceleration data associated with vibration of bones in a head of the wearer when presenting an audio signal to the wearer via the bone conduction transducer 120. The accelerometer 125 may provide the measured acceleration data to the controller 130 for, e.g., calibration of the bone conduction transducer 120. In some embodiments, the accelerometer 125 is removed from the headset 100 after calibration. The audio system of the headset 100 may include one accelerometer 125 for each wearer's ear. The bone conduction transducer 120 may be further coupled to one or more additional or alternative components (not shown in FIG. 1), e.g., a force sensor (i.e., a load cell) and/or a binaural microphone that can be embedded into the frame 105. The force sensor (e.g., one for each wearer's ear) may measure a force applied to bones in a head of the wearer when presenting an audio signal to the wearer via the bone conduction transducer 120. The binaural microphone (e.g., one for each wearer's ear) may measure a sound pressure in an ear canal of the wearer when presenting an audio signal to the wearer via the bone conduction transducer 120. The measured data may be provided from the force sensor and/or the binaural microphone to the controller 130 for, e.g., calibration of the bone conduction transducer 120. Additional details regarding methods for calibration of the bone conduction transducer 120 are provided in conjunction with FIG. 3 and FIGS. 4A-4D.

The air conduction transducer 135 produces sound by generating an airborne acoustic pressure wave in the ear of the wearer. The air conduction transducer 135 is coupled to an end piece of the frame 105 and is placed in front of an entrance to the ear of the wearer. The air conduction transducer 135 also receives audio instructions from the controller 130. The air conduction transducer 135 may include one or more transducers to cover different parts of a frequency range. For example, a piezoelectric transducer may be used to cover a first part of a frequency range and a moving coil transducer may be used to cover a second part of a frequency range. In accordance with embodiments of the present disclosure, the air conduction transducer 135 can be used for calibration of the bone conduction transducer 120. In some embodiments, the air conduction transducer 135 is removed from the headset 100 after the calibration. The audio system of the headset 100 may include one air conduction transducer 135 for each wearer's ear. Additional details regarding the air conduction transducer 135 are provided in conjunction with FIG. 3 and FIG. 4A.

The acoustic sensor 140 detects an acoustic pressure wave at the entrance of the ear of the wearer. The acoustic sensor 140 is coupled to an end piece of the frame 105. The acoustic sensor 140, as shown in FIG. 1, may comprise a microphone positioned at the entrance of the wearer's ear. In this embodiment, the microphone may directly measure the acoustic pressure wave at the entrance of the ear of the wearer.

Alternatively, the acoustic sensor 140 is a vibration sensor configured to be coupled to the back of the auricle of the wearer. The vibration sensor may indirectly measure the acoustic pressure wave at the entrance of the ear. For example, the vibration sensor may measure a vibration that is a reflection of the acoustic pressure wave at the entrance of the ear and/or measure a vibration created by the transducer assembly on the auricle of the ear of the wearer which may be used to estimate the acoustic pressure wave at the entrance of the wearer. In one embodiment, a mapping between acoustic pressure generated at the entrance to the ear canal and a vibration level generated on the auricle is an experimentally determined quantity that is measured on a representative sample of wearers and stored. This stored mapping between the acoustic pressure and vibration level (e.g., frequency dependent linear mapping) of the auricle is applied to a measured vibration signal from the vibration sensor which serves as a proxy for the acoustic pressure at the entrance of the ear canal. The vibration sensor can be an accelerometer or a piezoelectric sensor. The accelerometer may be a piezoelectric accelerometer or a capacitive accelerometer. The capacitive accelerometer senses change in capacitance between structures which can be moved by an accelerative force. In some embodiments, the acoustic sensor 140 is removed from the headset 100 after calibration. The audio system of the headset 100 may include one acoustic sensor 140 for each wearer's ear. Additional details regarding the acoustic sensor 140 are provided in conjunction with FIG. 3 and FIG. 4A.

The controller 130 provides audio instructions to the bone conduction transducer 120. During calibration of the bone conduction transducer 120, the controller 130 may provide audio instructions to the air conduction transducer 135. The controller 130 may also receive sensor data from the accelerometer 125 and/or the acoustic sensor 140 regarding the produced sound, and calibrates the bone conduction transducer 120 based on the received sensor data. The audio instructions may be generated by the controller 130. The controller 130 may receive audio content (e.g., music, calibration signal) from a console for presentation to a wearer and generate audio instructions based on the received audio content. Audio instructions instruct each transducer assembly how to produce vibrations. For example, audio instructions may include a content signal (e.g., a target waveform based on the audio content to be provided), a control signal (e.g., to enable or disable the transducer assembly), and a gain signal (e.g., to scale the content signal by increasing or decreasing an amplitude of the target waveform). The controller 130 also receives information from the acoustic sensor 140 that describes the produced sound at an ear of the wearer. In one embodiment, the controller 130 receives monitored vibration of an auricle by the acoustic sensor 140 and applies a previously stored frequency dependent linear mapping of pressure to vibration to determine the acoustic pressure wave at the entrance of the ear based on the monitored vibration. The controller 130 uses the received information as feedback to calibrate bone conduction transducer 120. The controller 130 is embedded into the frame 105 of the headset 100. In other embodiments, the controller 130 may be located in a different location. For example, the controller 130 may be part of the bone conduction transducer 120 or located external to the headset 100. Additional details regarding the controller 130 and the controller's 130 operation with other components of the audio system are provided in conjunction with FIG. 3 and FIGS. 4A-4D.

Figure 2:
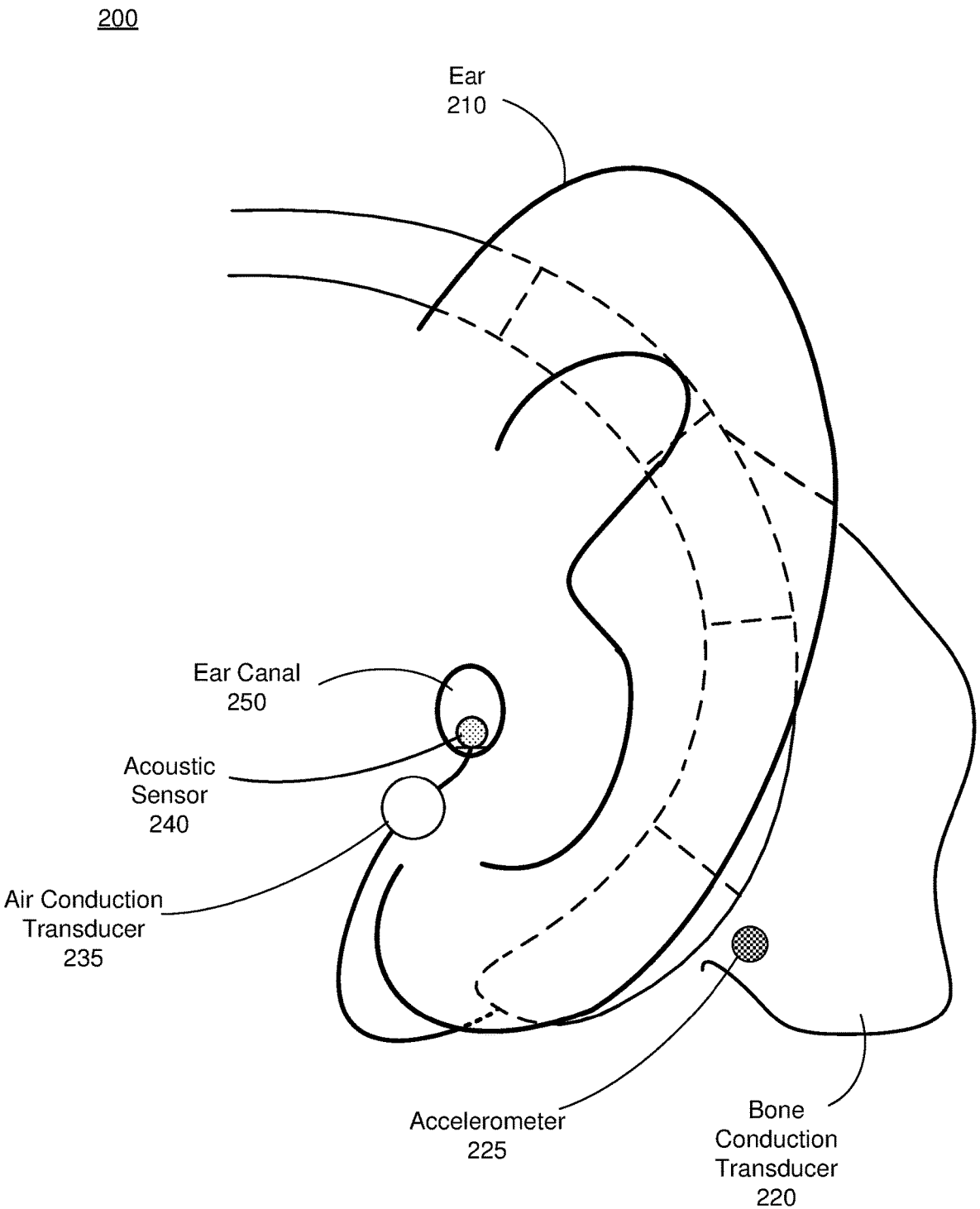
FIG. 2 is a profile view of a portion of an audio system as a component of a headset, in accordance with one or more embodiments.

FIG. 2 is a profile view 200 of a portion of an audio system as a component of a headset (e.g., the headset 100), in accordance with one or more embodiments. A bone conduction transducer 220, an accelerometer 225, an air conduction transducer 235, and an acoustic sensor 240 are embodiments of the bone conduction transducer 120, the accelerometer 125, the air conduction transducer 135, and the acoustic sensor 140, respectively.

The bone conduction transducer 220 may be coupled to a portion of the wearer's bone behind the wearer's ear 210. Alternatively, the bone conduction transducer 220 may be placed at a condyle, i.e., in front of the wearer's ear 210. The bone conduction transducer 220 may vibrate over a plurality of frequencies. The bone conduction transducer 220 vibrates the portion of the bone to which it is coupled. The portion of the bone conducts the vibrations to create a plurality of bone/tissue borne acoustic pressure waves at the cochlea which is then perceived by the wearer as sound. Although the portion of the audio system, as shown in FIG. 2, illustrates one bone conduction transducer 220, one accelerometer 225, one air conduction transducer 235, and one acoustic sensor 240 configured to produce audio content for one ear 210 of the wearer and to calibrate the bone conduction transducer 220, other embodiments include an identical setup to produce audio content for the other ear of the wearer. Other embodiments of the audio system comprise any combination of one or more bone conduction transducer assemblies and one or more air conduction transducer assemblies. The accelerometer 225 includes a sensor coupled to the bone conduction transducer 220 that measures acceleration data associated with vibration of wearer's bones when presenting an audio signal via the bone conduction transducer 220.

The air conduction transducer 235 includes a speaker (e.g., a voice coil transducer, or a balanced armature transducer, etc.) that vibrates over a range of frequencies to generate a range of airborne acoustic pressure waves at the entrance of the ear 210. The airborne acoustic pressure waves travel from the entrance of the ear 210 down an ear canal 250 where an eardrum is located. The eardrum vibrates due to fluctuations of the airborne acoustic pressure waves which are then detected as sound by a cochlea of the wearer (not shown in FIG. 2). The acoustic sensor 240 includes a microphone positioned at the entrance of the ear 210 of the wearer to detect the acoustic pressure waves produced by the air conduction transducer 235.

Figure 3:
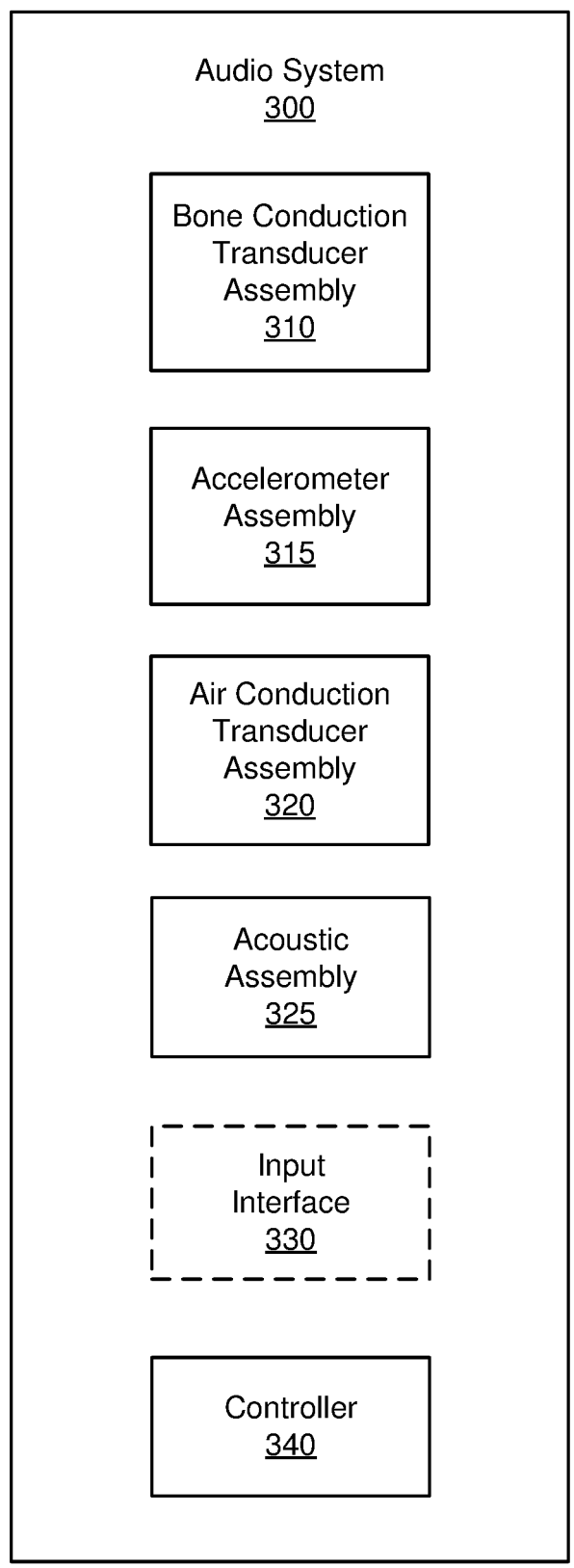
FIG. 3 is a block diagram of an audio system, in accordance with one or more embodiments.

FIG. 3 is a block diagram of an audio system 300, in accordance with one or more embodiments. The audio system in FIG. 1 is an embodiment of the audio system 300. The audio system 300 includes a bone conduction transducer assembly 310, an accelerometer assembly 315, an air conduction transducer assembly 320, an acoustic assembly 325, and a controller 340. In one embodiment, the audio system 300 further comprises an input interface 330. In other embodiments, the audio system 300 can have any combination of the components listed with any additional components.

The bone conduction transducer assembly 310 may include a plurality of bone conduction transducers, e.g., one bone conduction transducer for each wearer's ear. The bone conduction transducer 120 of FIG. 1 and the bone conduction transducer 220 of FIG. 2 are embodiments of the bone conduction transducers of the bone conduction transducer assembly 310. A bone conduction transducer of the bone conduction transducer assembly 310 is configured to vibrate the wearer's bone to be detected directly by the cochlea in accordance with audio instructions (e.g., received from the controller 340). The bone conduction transducer assembly 310 may be in direct contact with a portion of the wearer's head. In one implementation, the bone conduction transducer assembly 310 is in direct contact with the wearer's skull behind the wearer's ear. In another implementation, the bone conduction transducer assembly 310 is in direct contact with the wearer's jaw. The bone conduction transducer assembly 310 includes at least one transducer for each ear to vibrate in accordance with the audio instructions from the controller 340. The bone conduction transducer assembly 310 can vary amplitude of vibration, e.g., based on the audio instructions from the controller 340. More details about operations of the bone conduction transducer assembly 310 is provided in conjunction with FIGS. 4A-4D.

The accelerometer assembly 315 may include a plurality of accelerometers, e.g., one accelerometer for each wearer's ear. The accelerometer 125 of FIG. 1 and the accelerometer 225 of FIG. 2 are embodiments of the accelerometers of the accelerometer assembly 315. Each accelerometer of the accelerometer assembly 315 may be coupled to the bone conduction transducer assembly 310. The accelerometer assembly 315 may be configured to measure acceleration data associated with vibration of bones in a head of the wearer when presenting an audio signal (i.e., a tone) to the wearer via the bone conduction transducer assembly 315. The accelerometer assembly 315 may provide the measured acceleration data to the controller 340 for, e.g., calibration of the bone conduction transducer assembly 310. The accelerometers of the accelerometer assembly 315 may be piezoelectric or capacitive. A piezoelectric accelerometer can generate an electrical signal when the piezoelectric material is deformed by an accelerative force. The piezoelectric material may be a polymer (e.g., PVC, PVDF), a polymer-based composite, ceramic, or crystal (e.g., $SiO_2$, PZT). By applying a pressure on the piezoelectric material, the piezoelectric material changes in polarization and produces an electrical signal. A capacitive accelerometer measures changes in capacitance between structures which can be moved by an accelerative force. In some embodiments, the accelerometer assembly 315 is removed from the audio system 300 after the calibration. Advantages of removing the accelerometer assembly 315 include making the audio system 300 easier to wear while reducing volume and weight of the audio system 300 and potentially a headset (e.g., headset 100) of which the audio system 300 is a component. More details about operation of the accelerometer assembly 315 for calibration of the bone conduction transducer assembly 310 is provided in conjunction with FIGS. 4B-4D.

In some embodiments, the audio system 300 includes the air conduction transducer assembly 320. The air conduction transducer assembly 320 may include a plurality of air conduction transducers, e.g., one air conduction transducer for each wearer's ear. The air conduction transducer 135 of FIG. 1 and the air conduction transducer 235 of FIG. 2 are embodiments of the air conduction transducer of the air conduction transducer assembly 320. An air conduction transducer of the air conduction transducer assembly 320 is configured to vibrate to generate acoustic pressure waves at an entrance of the wearer's ear in accordance with audio instructions (e.g., received from the controller 340). An air conduction transducer of the air conduction transducer assembly 320 may be located in front of an entrance of the wearer's ear. Optimally, an air conduction transducer of the air conduction transducer assembly 320 is unobstructed being able to generate acoustic pressure waves directly at the entrance of the wearer's ear. The air conduction transducer assembly 320 includes at least one transducer for each wearer's ear to vibrate over a frequency range to create an acoustic pressure wave in accordance with the audio instructions. Over the frequency range, the air conduction transducer assembly 320 can vary amplitude of vibration to affect amplitude of acoustic pressure waves produced. In some embodiments, an air conduction transducer of the air conduction transducer assembly 320 is configured to vibrate over the same frequency range as a bone conduction transducer of the bone conduction transducer assembly 310. In accordance with embodiments of the present disclosure, the air conduction transducer assembly 320 can be used for calibration of the bone conduction transducer assembly 310 and can be removed from the audio system 300 after the calibration. Advantages of removing the air conduction transducer assembly 320 include making the audio system 300 easier to wear while reducing volume and weight of the audio system 300 and potentially a headset (e.g., headset 100) of which the audio system 300 is a component. More details about operation of the air conduction transducer assembly 320 for calibration of the bone conduction transducer assembly 310 is provided in conjunction with FIGS. 4A-4D.

In some embodiments, the audio system 300 includes the acoustic assembly 325. The acoustic assembly 325 may include a plurality of acoustic sensors, e.g., one acoustic sensor for each wearer's ear. The acoustic sensor 140 of FIG. 1 and the acoustic sensor 240 of FIG. 2 are embodiments of the acoustic sensors of the acoustic assembly 325. An acoustic sensor of the acoustic assembly 325 detects acoustic pressure waves at the entrance of the wearer's ear. One or more acoustic sensors of the acoustic assembly 325 may be positioned at an entrance of each ear of a wearer. The one or more acoustic sensors are configured to detect the airborne acoustic pressure waves formed at an entrance of the wearer's ears. In one embodiment, the acoustic assembly 325 provides information regarding the produced sound to the controller 340. The acoustic assembly 325 transmits feedback information of the detected acoustic pressure waves to the controller 340, and the feedback information may be used by the controller 340 for calibration of the bone conduction transducer assembly 310. Responsive to completing the calibration, the acoustic assembly 325 may be uncoupled from the audio system 300. Advantages of removing the acoustic assembly 325 include making the audio system 300 easier to wear while reducing volume and weight of the audio system 300 and potentially a headset (e.g., headset 100) of which the audio system 300 is a component. More details about operation of the acoustic assembly 325 for calibration of the bone conduction transducer assembly 310 is provided in conjunction with FIG. 4A.

In one embodiment, the acoustic assembly 325 includes a microphone positioned at an entrance of each ear of a wearer. A microphone is a transducer that converts pressure into an electrical signal. The frequency response of the microphone may be relatively flat in some portions of a frequency range and may be linear in other portions of a frequency range. The microphone may be configured to receive a signal from the controller 340 to scale a detected signal from the microphone based on the audio instructions provided to the air conduction transducer assembly 320. For example, the signal may be adjusted based on the audio instructions to avoid clipping of the detected signal or for improving a signal to noise ratio in the detected signal.

In another embodiment, the acoustic assembly 325 includes a vibration sensor. The vibration sensor is coupled to a portion of the wearer's ear. In some embodiments, the vibration sensor and the air conduction transducer assembly 320 couple to different portions of the ear. The vibration sensor is similar to the transducer used in the air conduction transducer assembly 320 except the signal is flowing in reverse. Instead of an electrical signal producing a mechanical vibration in a transducer, a mechanical vibration is generating an electrical signal in the vibration sensor. A vibration sensor may be made of piezoelectric material that can generate an electrical signal when the piezoelectric material is deformed. The piezoelectric material may be a polymer (e.g., PVC, PVDF), a polymer-based composite, ceramic, or crystal (e.g., $SiO_2$, PZT). By applying a pressure on the piezoelectric material, the piezoelectric material changes in polarization and produces an electrical signal. The piezoelectric sensor may be coupled to a material (e.g., silicone) that attaches well to the back of wearer's ear. A vibration sensor can also be an accelerometer. The accelerometer may be piezoelectric or capacitive. In one embodiment, the vibration sensor maintains good surface contact with the back of the wearer's ear and maintains a steady amount of application force (e.g., 1 Newton) to the wearer's ear. The vibration sensor may be integrated in an internal measurement unit (IMU) integrated circuit (IC). The IMU is further described with relation to FIG. 5.

The input interface 330 provides a user of the audio system 300 (e.g., a wearer of the headset 100) an ability to toggle operation of the bone conduction transducer assembly 310 and the air conduction transducer assembly 320. The input interface 330 is an optional component, and in some embodiments is not part of the audio system 300. The input interface 330 is coupled to the controller 340. The input interface 330 provides audio source options for presenting audio content to the wearer. An audio source option is a wearer selectable option for having content presented to the wearer via a specific type of transducer assembly. The input interface 330 may provide audio source options as a physical dial for controlling the audio system 300 for selection by the wearer, as another physical switch (e.g., a slider, a binary switch, etc.), as a virtual menu with options to control the audio system 300, or some combination thereof. In one embodiment of the audio system 300 with two transducer assemblies comprising the bone conduction transducer assembly 310 and the air conduction transducer assembly 320, the audio source options include a first option for the bone conduction transducer assembly 310, a second option for the air conduction transducer assembly 320, and a third option for a combination of the bone conduction transducer assembly 310 and the air conduction transducer assembly 320. The input interface 330 may receive a selection of one audio source option of the plurality of audio source options. The input interface 330 may send the received selection to the controller 340.

The controller 340 controls components of the audio system 300. The controller 130 of FIG. 1 is an embodiment of the controller 340. The controller 340 generates audio instructions to instruct the bone conduction transducer assembly 310 and the air conduction transducer assembly 320 how to produce vibrations. For example, audio instructions may include a content signal (e.g., signal applied to the bone conduction transducer assembly 310 or the air conduction transducer assembly 320 to produce a vibration), a control signal to enable or disable any of the transducer assemblies, and a gain signal to scale the content signal (e.g., increase or decrease amplitude of vibrations produced by any of the transducer assemblies). In accordance with embodiments of the present disclosure, the controller 340 is configured to manage calibration of the audio system 300, i.e., of the bone conduction transducer assembly 310.

The controller 340 generates the audio instructions for the bone conduction transducer assembly 310 and the air conduction transducer assembly 320 for presenting multiple tones each at a different frequency to the wearer. The controller 340 further generates and records voltages for adjusting amplitudes of tones presented to the wearer via the bone conduction transducer assembly 310 to match (e.g., within a threshold range) with amplitudes of tones presented to the wearer via the air conduction transducer assembly 320. The controller 340 also obtains (e.g., from the acoustic assembly 325) information about an ear canal sound pressure resulting from each tone presented to the wearer via the air conduction transducer assembly 320. The controller 340 then generates an equalization filter based on the information about ear canal sound pressures and the recorded voltages. The generated equalization filter can be used for filtering an audio signal for presentation via the bone conduction transducer assembly 310, thus achieving calibration of the bone conduction transducer assembly 310. In some other embodiments, to achieve calibration of the bone conduction transducer assembly 310, the controller 340 generates the audio instructions for dynamically adjusting an audio signal provided to the wearer via the bone conduction transducer assembly 310 so that data acquired by the accelerometer assembly 315 is within a threshold from equalization data for the bone conduction transducer assembly 310.

In some embodiments, to generate the equalization filter, the controller 340 generates a transfer function based on ratios of corresponding recorded voltages and ear canal sound pressures. The controller 340 may normalize (e.g., in dB) a magnitude of the transfer function so that the maximum value of the transfer function is 0 dB. Additionally, or alternatively, the controller 340 may perform interpolation on the transfer function to generate an interpolated transfer function, i.e., a dense transfer function magnitude curve representing a filter response function. The negative frequency magnitude spectrum for the filter response function can be obtained by mirroring the positive frequency spectrum around 0 Hz. In order to create a causal response, the controller 340 may apply a linear phase shift to the filter response function either in frequency domain as a multiplication with a complex exponential or in time domain as a convolution with a delayed Kronecker Delta. The controller 340 may further perform the Inverse Fourier Transform of the causal frequency response to generate a time domain representation of the equalization filter. The controller 340 applies the equalization filter to an audio signal presented to the wearer via the bone conduction transducer assembly 310 by convolving the equalization filter with the audio signal in time domain. The filtered audio signal is scaled such that a level of loudness of the filtered audio signal is within the threshold range of a level of loudness of the audio signal if presented to the wearer via the air conduction transducer assembly 320. Additional details about operations of the controller 340 for calibration of the bone conduction transducer assembly 310 are provided in conjunction with FIGS. 4A-4D.

Figure 4A:
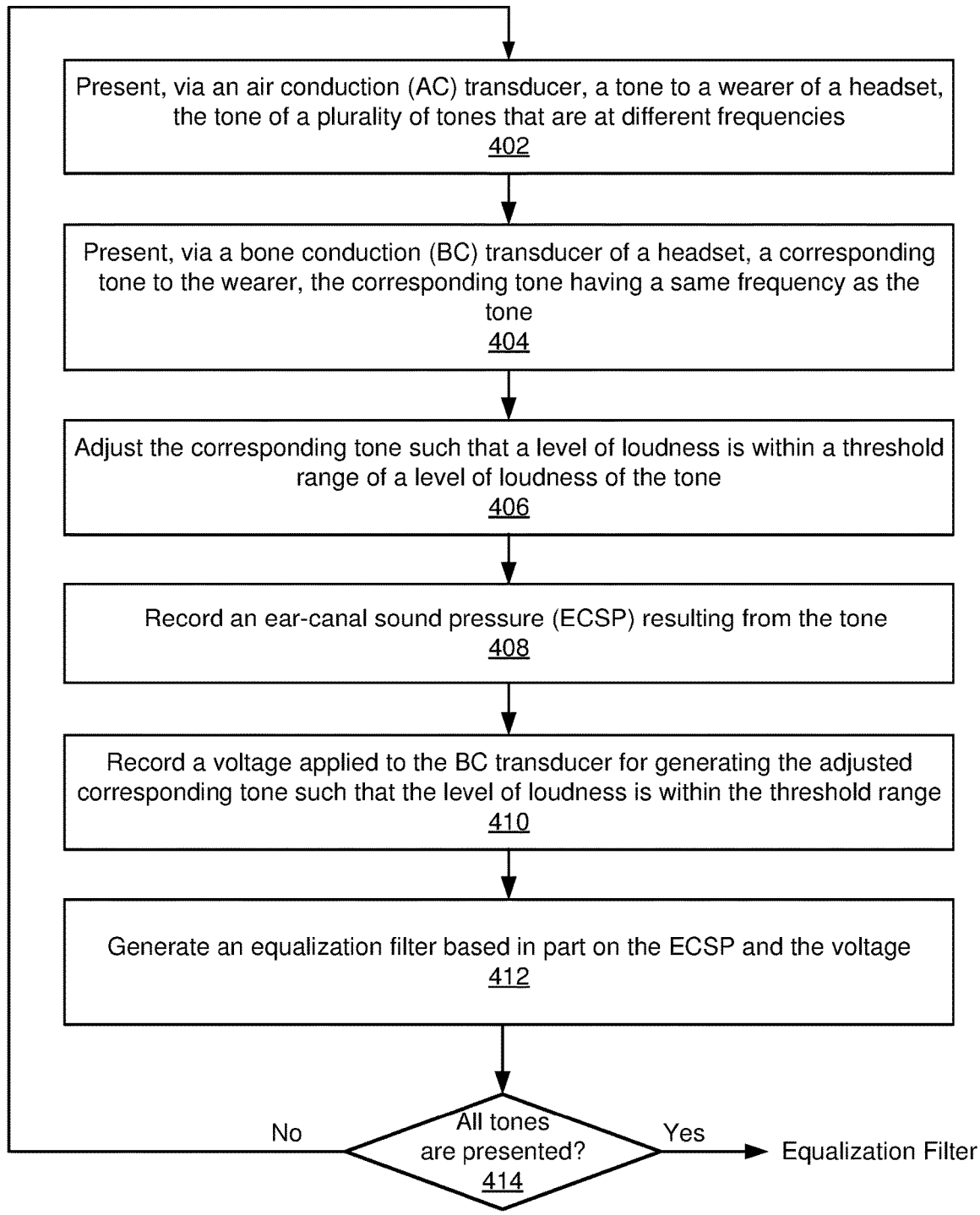
FIG. 4A is a flowchart illustrating a process for calibration of a headset having an audio system that includes a bone conduction transducer assembly, in accordance with one or more embodiments.

FIG. 4A is a flowchart illustrating a process 400 for calibration of a headset having an audio system that includes a bone conduction transducer assembly, in accordance with one or more embodiments. The process 400 of FIG. 4A may be performed by the components of an audio system, e.g., the audio system 300 of FIG. 3. Other entities (e.g., components of the headset 100 of FIG. 1 and/or components shown in FIG. 2) may perform some or all of the steps of the process in other embodiments. Likewise, embodiments may include different and/or additional steps, or perform the steps in different orders.

The audio system 300 presents 402, e.g., via the air conduction transducer assembly 320, a first tone to a wearer of a headset, the first tone of a plurality of tones that are at different frequencies. Upon presenting the first tone, the audio system 300 presents, e.g., via the air conduction transducer assembly 320, a second tone to the wearer, the second tone of the plurality of tones that is at a second frequency different than the frequency of the first tone. For a coarse calibration, a frequency of each presented tone may be at, e.g., a corresponding octave band. For a fine calibration, a frequency of each presented tone may be at, e.g., a corresponding one-third of each octave band. In some embodiments, tones presented for calibration are narrow-band noise signals centered around a defined range of target frequencies.

The audio system 300 presents 404, e.g., via the bone conduction transducer assembly 310, a corresponding tone to the wearer, the corresponding tone having a same frequency as the first tone. Upon presenting the corresponding tone, the audio system 300 presents, e.g., via the bone conduction transducer assembly 310, a corresponding second tone to the wearer, the corresponding second tone having a same frequency as the second tone.

The audio system 300 adjusts 406, e.g., via the controller 340, the corresponding tone such that a level of loudness is within a threshold range of a level of loudness of the first tone. The level of loudness of the adjusted corresponding tone may represent a level of amplitude of the adjusted corresponding tone perceived by the wearer. In some embodiments, the audio system 300 adjusts, e.g., via the controller 340, an amplitude of the corresponding tone such that the adjusted amplitude is within the threshold range of an amplitude of the first tone. Upon adjusting the corresponding tone, the audio system 300 adjusts, e.g., via the controller 340, the second corresponding tone such that a level of loudness is within the threshold range of a level of loudness of the second tone.

The audio system 300 records 408, e.g., via the acoustic assembly 325, an ear-canal sound pressure (ECSP) resulting from the first tone. The ECSP may represent an airborne acoustic pressure wave at an ear canal. The acoustic assembly 325 may measure the ECSP at the entrance to the ear canal. Upon recording the ECSP, the audio system 300 records, e.g., via the acoustic assembly 325, a second ECSP resulting from the second tone.

The audio system 300 records 410, e.g., via the controller 340, a voltage applied to the bone conduction transducer assembly 310 for generating the adjusted corresponding tone such that the level of loudness of the adjusted corresponding tone is within the threshold range of the level of loudness of the first tone. In some embodiments, the threshold range may be a defined value in dB. The audio system 300 may determine (e.g., via the controller 340) that the adjusted corresponding tone is within the threshold range of the level of loudness of the first tone if an amplitude of the adjusted corresponding tone is within the defined value in decibels from an amplitude of the first tone. In some other embodiments, the audio system 300 determines that the adjusted corresponding tone is within the threshold range of the level of loudness of the first tone, based on the wearer's perception that the first tone and the adjusted corresponding tone are the same. When the wearer perceives that the first tone and the adjusted corresponding tone are the same, the wearer may provide a corresponding matching feedback signal to the audio system 300, e.g., via pushing a button attached to the bone conduction transducer assembly 310 interfaced with the controller 340 that receives the matching feedback signal. Upon recording the voltage, the audio system 300 records, e.g., via the controller 340, a second voltage applied to the bone conduction transducer assembly 310 for generating the adjusted second corresponding tone such that the level of loudness of the adjusted second corresponding tone is within the threshold range of the level of loudness of the second tone.

The audio system 300 generates 412, e.g., via the controller 340, an equalization filter based in part on the ECSP and the voltage. The equalization filter can be used for filtering an audio signal for presentation via the bone conduction transducer assembly 310. The equalization filter may be generated based in part on a ratio of the voltage to the ECSP.

The audio system 300 determines 414 (e.g., via the controller 340) whether all tones of the plurality of tones are presented to the wearer. If not, the audio system 300 repeats steps 402-412 for another tone of the plurality of tones. Otherwise, if all tones of the plurality of tones are presented to the wearer, the equalization filter is generated.

Figure 4B:
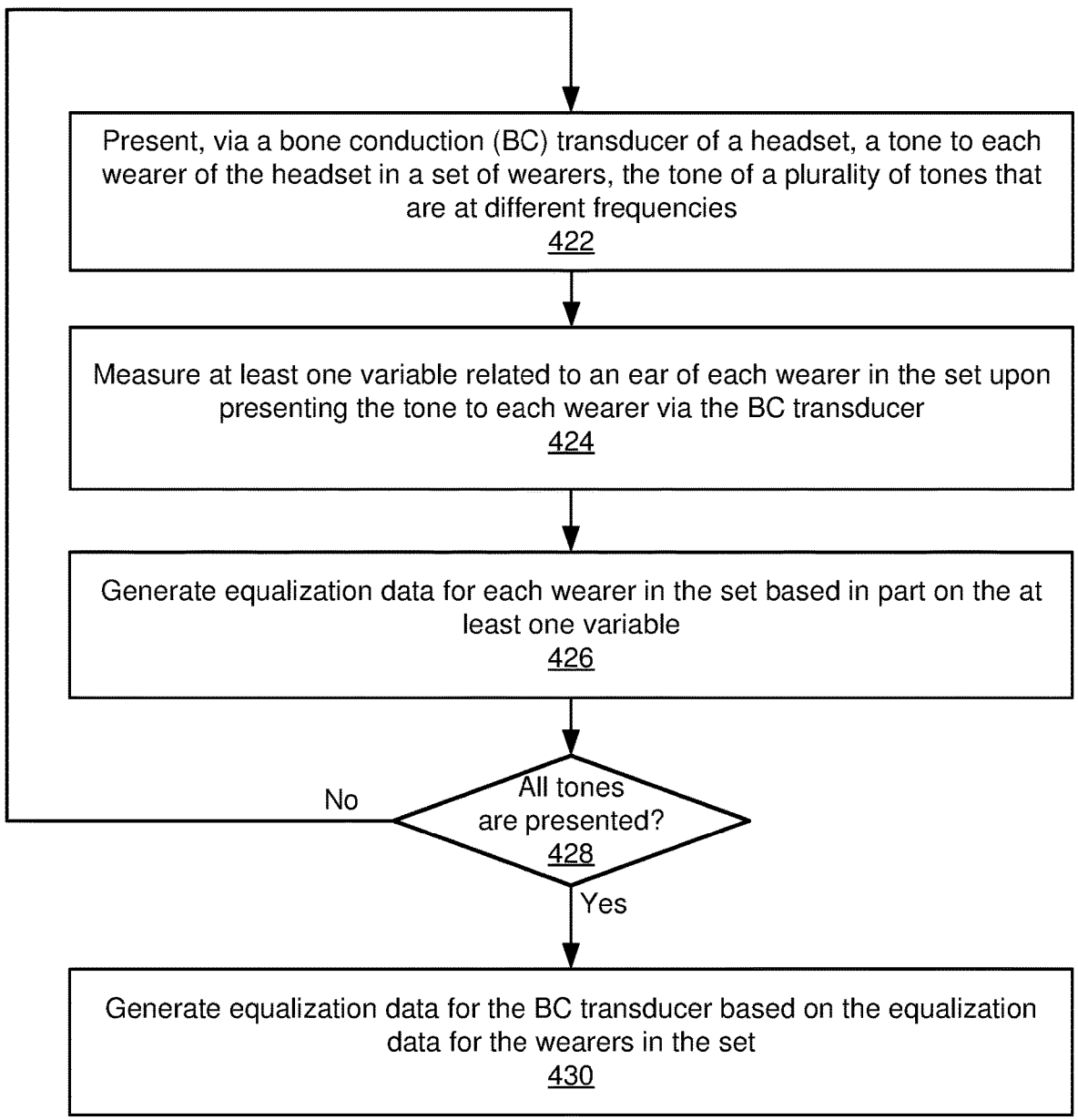
FIG. 4B is a flowchart illustrating a process for generating equalization data for a bone conduction transducer assembly of an audio system of a headset, in accordance with one or more embodiments.

FIG. 4B is a flowchart illustrating a process 420 for generating equalization data for the bone conduction transducer assembly 310 of the audio system 300, in accordance with one or more embodiments. The equalization data may include a set of acceleration values for a set of frequencies, each acceleration value in the set is an acceleration of bones in a head of the wearer when presenting an audio signal to the wearer via the bone conduction transducer assembly 310 at one frequency in the set of frequencies. The process 400 of FIG. 4 may be performed by the components of the audio system 300. Other entities (e.g., components of the headset 100 of FIG. 1 and/or components shown in FIG. 2) may perform some or all of the steps of the process in other embodiments. Likewise, embodiments may include different and/or additional steps, or perform the steps in different orders.

The process 420 generally occurs prior to the process 400 of FIG. 4A. Also, the process 420 can occur at a different location than the process 400. For example, the process 420 can be performed, e.g., during manufacturing of the audio system 300, and not in relation to the end user (wearer). The process 420 may be thus performed prior to the wearer use case.

The audio system 300 presents 422, e.g., via the bone conduction transducer assembly 310, a tone to each wearer of the headset in a set of wearers, the tone of a plurality of tones that are at different frequencies. For a coarse calibration, a frequency of each presented tone may be at, e.g., a corresponding octave band. For a fine calibration, a frequency of each presented tone may be at, e.g., a corresponding one-third of each octave band. In some embodiments, tones presented for calibration are narrow-band noise signals centered around a defined range of target frequencies. The set of wearers may be determined based on similarities with the wearer. The wearers in the set may correspond to persons having different head sizes (e.g., small, medium and large head sizes). For statistical relevance, a population of, e.g., at least 50 tones may be presented for each group of wearers, each group sharing one or more features (e.g., a head size) among all wearers in that group. In some embodiments, the tone may be presented to the wearer via the bone conduction transducer assembly 310 during the calibration process 400 of FIG. 4A.

The audio system 300 measures 424, e.g., via a sensor of the audio system 300, at least one variable related to an ear of each wearer in the set upon presenting the tone to each wearer via the bone conduction transducer assembly 310. The at least one variable may include, e.g., acceleration data associated with vibration of bones in a wearer's head, a force applied to bones in a wearer's head, a sound pressure in an ear canal of the wearer, some other variable, or some combination thereof. In some embodiments, the audio system 300 measures, e.g., via the accelerometer assembly 315, the at least one variable as acceleration data associated with vibration of bones in a head of the wearer when presenting the tone to the wearer via the bone conduction transducer assembly 310. In some other embodiments, the audio system 300 measures, e.g., via a force sensor, the at least one variable as a force applied to bones in a head of the wearer when presenting the tone to the wearer via the bone conduction transducer assembly 310. In some other embodiments, the audio system 300 measures, e.g., via a binaural microphone, the at least one variable as a sound pressure in an ear canal of the wearer when presenting the corresponding tone to the wearer via the bone conduction transducer assembly 310.

The audio system 300 generates 426, e.g., via the controller 340, equalization data for each wearer in the set based in part on the at least one measured variable. In some embodiments, the equalization data is generated as a set of acceleration data (or a set of forces applied to bones in a wearer's head, a set of sound pressures in an ear canal, or combination thereof) measured by the accelerometer assembly 315 for a set of frequencies at which different tones are presented via the bone conduction transducer assembly 310. The audio system 300 determines 428, e.g., via the controller 340, whether all tones of the plurality of tones are presented to each wearer in the set via the bone conduction transducer assembly 310. If not, the steps 422-426 are repeated. Otherwise, if all tones of the plurality of tones are presented, the equalization data for each wearer in the set are generated.

The audio system generates 430, e.g., via the controller 340, equalization data for the bone conduction transducer assembly 310 based on the equalization data for the wearers in the set. In some embodiments, the controller 340 determines the equalization data for the bone conduction transducer assembly 310 by averaging the equalization data for at least a portion of the wearers in the set. For example, the wearers in the set may correspond to persons having different head sizes (e.g., small, medium and large head sizes). The controller 340 may store (e.g., in a memory coupled to the controller 340) the equalization data for the bone conduction transducer assembly 310 for later use.

Figure 4C:
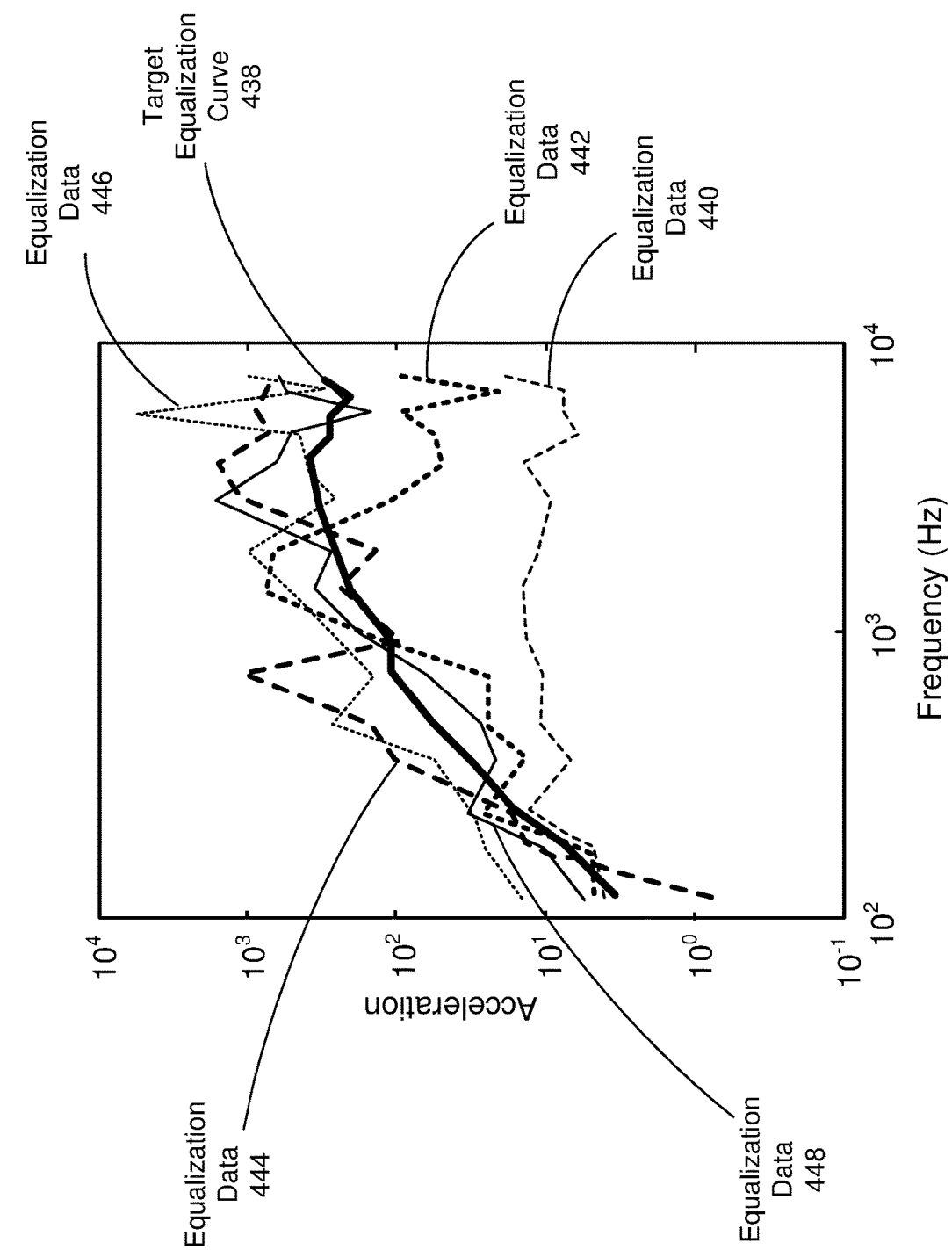
FIG. 4C is a graph showing a target equalization curve for a bone conduction transducer assembly of an audio system in a headset and equalization data for each wearer of the headset in a set of wearers, in accordance with one or more embodiments.

FIG. 4C is a graph 435 showing an example target equalization curve 438 (i.e., equalization data) for the bone conduction transducer assembly 310 and equalization data for each wearer in the set, in accordance with one or more embodiments. The equalization data for each wearer in the set (e.g., equalization data 440, 442, 444, 446, 448 shown in FIG. 4C) are obtained by measuring, e.g., via the accelerometer assembly 315, acceleration values associated with vibration of bones in a head of that wearer when presenting the plurality of tones at a plurality of frequencies to that wearer via the bone conduction transducer assembly 310. The controller 340 may generate the target equalization curve 438 (i.e., equalization data) for the bone conduction transducer assembly 310 shown in FIG. 4C, based on the equalization data for all wearers in the set, e.g., by averaging the equalization data for all wearers in the set. Note that FIG. 4C illustrates the example graph 435 with equalization data for some and not all wearers in the set.

FIG. 4D is a flowchart illustrating a process 450 for calibration of a headset (e.g., the headset 100) having an audio system 300 that includes a bone conduction transducer assembly 310, in accordance with one or more embodiments. The process 450 of FIG. 4D may be performed by the components of an audio system, e.g., the audio system 300 of FIG. 3. Other entities (e.g., components of the headset 100 of FIG. 1 and/or components shown in FIG. 2) may perform some or all of the steps of the process in other embodiments. Likewise, embodiments may include different and/or additional steps, or perform the steps in different orders.

The audio system 300 presents 452, e.g., via the bone conduction transducer assembly 310, an audio signal to a wearer of the headset. The presented audio signal may comprise one frequency component or multiple frequency components.

The audio system 300 monitors 454, e.g., via a sensor of the audio system 300, sensor data related to at least one variable related to an ear of the wearer measured upon presenting the audio signal to the wearer via the bone conduction transducer assembly 310. In some embodiments, the audio system 300 measures, e.g., via the accelerometer assembly 315, the at least one variable as acceleration data associated with vibration of bones in a head of the wearer when presenting the audio signal to the wearer via the bone conduction transducer assembly 310.

The audio signal 300 dynamically adjusts 456, e.g., via the controller 340, the audio signal provided to the wearer via the bone conduction transducer assembly 310 so that the monitored sensor data is within a threshold (e.g., within 1%) from the corresponding equalization data for the bone conduction transducer assembly 310 (e.g., the target equalization curve 438 shown in FIG. 4C). In some embodiments, the equalization data for the bone conduction transducer assembly 310 are generated during the process 420 of FIG. 4B and retrieved from e.g., a memory coupled the controller 340.

System Environment

Figure 5:
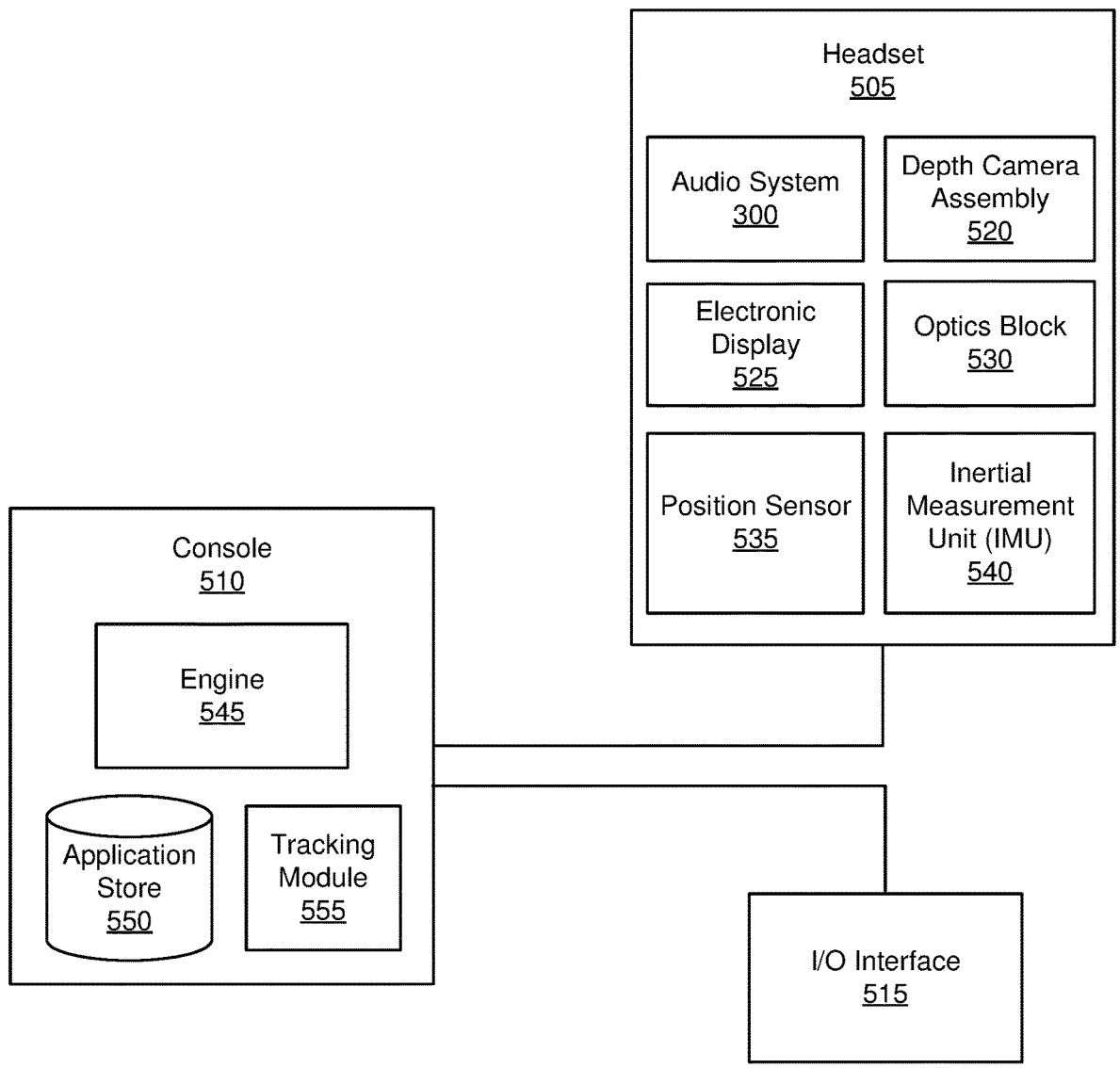
FIG. 5 is a block diagram of a system environment that includes a headset with an audio system, in accordance with one or more embodiments.

FIG. 5 is a system environment 500 of headset including an audio system, in accordance with one or more embodiments. The system 500 may operate in an artificial reality environment, e.g., a virtual reality, an augmented reality, a mixed reality environment, or some combination thereof. The system 500 shown by FIG. 5 comprises headset 505 and an input/output (I/O) interface 515 that is coupled to a console 510. The headset 505 may be an embodiment of the headset 100. While FIG. 5 shows an example system 500 including one headset 505 and one I/O interface 515, in other embodiments, any number of these components may be included in the system 500. For example, there may be multiple headsets 505 each having an associated I/O interface 515 with each headset 505 and I/O interface 515 communicating with the console 510. In alternative configurations, different and/or additional components may be included in the system 500. Additionally, functionality described in conjunction with one or more of the components shown in FIG. 5 may be distributed among the components in a different manner than described in conjunction with FIG. 5 in some embodiments. For example, some or all of the functionality of the console 510 is provided by the headset 505.

The headset 505 may be a NED or HMD that presents content to a wearer comprising augmented views of a physical, real-world environment with computer-generated elements (e.g., two dimensional (2D) or three dimensional (3D) images, 2D or 3D video, sound, etc.). In some embodiments, the presented content includes audio that is presented via an audio system 300 that receives audio information from the headset 505, the console 510, or both, and presents audio data based on the audio information. In some embodiments, the headset 505 presents virtual content to the wearer that is based in part on a real environment surrounding the wearer. For example, virtual content may be presented to a wearer of the headset. The wearer physically may be in a room, and virtual walls and a virtual floor of the room are rendered as part of the virtual content.

The headset 505 includes the audio system 300 of FIG. 3 for presenting audio signals to the wearer of the headset 505. The air conduction transducer assembly 320 of the audio system 300 presents a first tone to a wearer of the headset 505, the first tone of a plurality of tones that are at different frequencies. The acoustic assembly 325 of the audio system 300 record an ECSP resulting from the first tone. The bone conduction transducer assembly 310 of the audio system 300 presents a corresponding tone to the wearer, the corresponding tone having a same frequency as the first tone. The controller 340 of the audio system 300 controls operations for calibration of the bone conduction transducer assembly 310. The controller 340 of the audio system 300 adjusts the corresponding tone such that a level of loudness is within a threshold range of a level of loudness of the first tone. The controller 340 of the audio system 300 records a voltage applied to the bone conduction transducer assembly 310 for generating the adjusted corresponding tone such that the level of loudness of the adjusted corresponding tone is within the threshold range of the level of loudness of the first tone. The controller 340 of the audio system 300 generates an equalization filter based in part on the ECSP and the voltage. The equalization filter may be applied for filtering an audio signal for presentation to the wearer of the headset 505 via the bone conduction transducer assembly 310 of the audio system 300.

The headset 505 may include a depth camera assembly (DCA) 520, an electronic display 525, an optics block 530, one or more position sensors 535, and an inertial measurement Unit (IMU) 540. The electronic display 525 and the optics block 530 is one embodiment of a lens 110. The position sensors 535 and the IMU 540 is one embodiment of sensor device 115. Some embodiments of the headset 505 have different components than those described in conjunction with FIG. 5. Additionally, the functionality provided by various components described in conjunction with FIG. 5 may be differently distributed among the components of the headset 505 in other embodiments, or be captured in separate assemblies remote from the headset 505.

The DCA 520 captures data describing depth information of a local area surrounding some or all of the headset 505. The DCA 520 may include a light generator, an imaging device, and a DCA controller that may be coupled to both the light generator and the imaging device. The light generator illuminates a local area with illumination light, e.g., in accordance with emission instructions generated by the DCA controller. The DCA controller is configured to control, based on the emission instructions, operation of certain components of the light generator, e.g., to adjust an intensity and a pattern of the illumination light illuminating the local area. In some embodiments, the illumination light may include a structured light pattern, e.g., dot pattern, line pattern, etc. The imaging device captures one or more images of one or more objects in the local area illuminated with the illumination light. The DCA 520 can compute the depth information using the data captured by the imaging device or the DCA 520 can send this information to another device such as the console 510 that can determine the depth information using the data from the DCA 520.

The electronic display 525 displays 2D or 3D images to the wearer in accordance with data received from the console 510. In various embodiments, the electronic display 525 comprises a single electronic display or multiple electronic displays (e.g., a display for each eye of a wearer). Examples of the electronic display 525 include: a liquid crystal display (LCD), an organic light emitting diode (OLED) display, an active-matrix organic light-emitting diode display (AMO-LED), some other display, or some combination thereof.

The optics block 530 magnifies image light received from the electronic display 525, corrects optical errors associated with the image light, and presents the corrected image light to a wearer of the headset 505. In various embodiments, the optics block 530 includes one or more optical elements. Example optical elements included in the optics block 530 include: a waveguide, an aperture, a Fresnel lens, a convex lens, a concave lens, a filter, a reflecting surface, or any other suitable optical element that affects image light. Moreover, the optics block 530 may include combinations of different optical elements. In some embodiments, one or more of the optical elements in the optics block 530 may have one or more coatings, such as partially reflective or anti-reflective coatings.

Magnification and focusing of the image light by the optics block 530 allows the electronic display 525 to be physically smaller, weigh less, and consume less power than larger displays. Additionally, magnification may increase the field of view of the content presented by the electronic display 525. For example, the field of view of the displayed content is such that the displayed content is presented using almost all (e.g., approximately 110 degrees diagonal), and in some cases all, of the wearer's field of view. Additionally, in some embodiments, the amount of magnification may be adjusted by adding or removing optical elements.

In some embodiments, the optics block 530 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display 525 for display is pre-distorted, and the optics block 530 corrects the distortion when it receives image light from the electronic display 525 generated based on the content.

The IMU 540 is an electronic device that generates data indicating a position of the headset 505 based on measurement signals received from one or more of the position sensors 535. A position sensor 535 generates one or more measurement signals in response to motion of the headset 505. Examples of position sensors 535 include: one or more accelerometers, one or more gyroscopes, one or more magnetometers, another suitable type of sensor that detects motion, a type of sensor used for error correction of the IMU 540, or some combination thereof. The position sensors 535 may be located external to the IMU 540, internal to the IMU 540, or some combination thereof.

Based on the one or more measurement signals from one or more position sensors 535, the IMU 540 generates data indicating an estimated current position of the headset 505 relative to an initial position of the headset 505. For example, the position sensors 535 include multiple accelerometers to measure translational motion (forward/back, up/down, left/right) and multiple gyroscopes to measure rotational motion (e.g., pitch, yaw, and roll). In some embodiments, the IMU 540 rapidly samples the measurement signals and calculates the estimated current position of the headset 505 from the sampled data. For example, the IMU 540 integrates the measurement signals received from the accelerometers over time to estimate a velocity vector and integrates the velocity vector over time to determine an estimated current position of a reference point on the headset 505. Alternatively, the IMU 540 provides the sampled measurement signals to the console 510, which interprets the data to reduce error. The reference point is a point that may be used to describe the position of the headset 505. The reference point may generally be defined as a point in space or a position related to the headset's 505 orientation and position.

The I/O interface 515 is a device that allows a wearer to send action requests and receive responses from the console 510. An action request is a request to perform a particular action. For example, an action request may be an instruction to start or end capture of image or video data, or an instruction to perform a particular action within an application. The I/O interface 515 may include one or more input devices. Example input devices include: a keyboard, a mouse, a game controller, or any other suitable device for receiving action requests and communicating the action requests to the console 510. An action request received by the I/O interface 515 is communicated to the console 510, which performs an action corresponding to the action request. In some embodiments, the I/O interface 515 includes an IMU 540, as further described above, that captures calibration data indicating an estimated position of the I/O interface 515 relative to an initial position of the I/O interface 515. In some embodiments, the I/O interface 515 may provide haptic feedback to the wearer in accordance with instructions received from the console 510. For example, haptic feedback is provided when an action request is received, or the console 510 communicates instructions to the I/O interface 515 causing the I/O interface 515 to generate haptic feedback when the console 510 performs an action.

The console 510 provides content to the headset 505 for processing in accordance with information received from one or more of: the headset 505 and the I/O interface 515. In the example shown in FIG. 5, the console 510 includes an application store 550, a tracking module 555 and an engine 545. Some embodiments of the console 510 have different modules or components than those described in conjunction with FIG. 5. Similarly, the functions further described below may be distributed among components of the console 510 in a different manner than described in conjunction with FIG. 5.

The application store 550 stores one or more applications for execution by the console 510. An application is a group of instructions, that when executed by a processor, generates content for presentation to the wearer. Content generated by an application may be in response to inputs received from the wearer via movement of the headset 505 or the I/O interface 515. Examples of applications include: gaming applications, conferencing applications, video playback applications, or other suitable applications.

The tracking module 555 calibrates the system environment 500 using one or more calibration parameters and may adjust one or more calibration parameters to reduce error in determination of the position of the headset 505 or of the I/O interface 515. Calibration performed by the tracking module 555 also accounts for information received from the IMU 540 in the headset 505 and/or an IMU 540 included in the I/O interface 515. Additionally, if tracking of the headset 505 is lost, the tracking module 555 may re-calibrate some or all of the system environment 500.

The tracking module 555 tracks movements of the headset 505 or of the I/O interface 515 using information from the one or more position sensors 535, the IMU 540, the DCA 520, or some combination thereof. For example, the tracking module 555 determines a position of a reference point of the headset 505 in a mapping of a local area based on information from the headset 505. The tracking module 555 may also determine positions of the reference point of the headset 505 or a reference point of the I/O interface 515 using data indicating a position of the headset 505 from the IMU 540 or using data indicating a position of the I/O interface 515 from an IMU 540 included in the I/O interface 515, respectively. Additionally, in some embodiments, the tracking module 555 may use portions of data indicating a position or the headset 505 from the IMU 540 to predict a future location of the headset 505. The tracking module 555 provides the estimated or predicted future position of the headset 505 or the I/O interface 515 to the engine 545.

The engine 545 also executes applications within the system environment 500 and receives position information, acceleration information, velocity information, predicted future positions, or some combination thereof, of the headset 505 from the tracking module 555. Based on the received information, the engine 545 determines content to provide to the headset 505 for presentation to the wearer. For example, if the received information indicates that the wearer has looked to the left, the engine 545 generates content for the headset 505 that mirrors the wearer's movement in a virtual environment or in an environment augmenting the local area with additional content. Additionally, the engine 545 performs an action within an application executing on the console 510 in response to an action request received from the I/O interface 515 and provides feedback to the wearer that the action was performed. The provided feedback may be visual or audible feedback via the headset 505 or haptic feedback via the I/O interface 515.

Additional Configuration Information

Embodiments according to the invention are in particular disclosed in the attached claims directed to a method and a headset, wherein any feature mentioned in one claim category, e.g. method, can be claimed in another claim category, e.g. headset, system, storage medium, and computer program product, as well. The dependencies or references back in the attached claims are chosen for formal reasons only. However any subject matter resulting from a deliberate reference back to any previous claims (in particular multiple dependencies) can be claimed as well, so that any combination of claims and the features thereof is disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

In an embodiment, a method may comprise: presenting, via an air conduction (AC) transducer, a first tone to a wearer of a headset, the first tone of a plurality of tones that are at different frequencies; presenting, via a bone conduction (BC) transducer of the headset, a corresponding tone to the wearer, the corresponding tone having a same frequency as the first tone; adjusting the corresponding tone such that a level of loudness is within a threshold range of a level of loudness of the first tone; recording an ear-canal sound pressure (ECSP) resulting from the first tone; recording a voltage applied to the BC transducer for generating the adjusted corresponding tone such that the level of loudness of the adjusted corresponding tone is within the threshold range of the level of loudness of the first tone; and generating an equalization filter based in part on the ECSP and the voltage, the equalization filter for filtering an audio signal for presentation via the BC transducer.

In an embodiment, a method may comprise: presenting, via the AC transducer, a second tone to the wearer, the second tone of the plurality of tones that is at a second frequency different than the frequency of the first tone; presenting, via the BC transducer, a corresponding second tone to the wearer, the corresponding second tone having a same frequency as the second tone; adjusting the second corresponding tone such that a level of loudness is within the threshold range of a level of loudness of the second tone; recording a second EC SP resulting from the second tone; recording a second voltage applied to the BC transducer for generating the adjusted second corresponding tone such that the level of loudness of the adjusted second corresponding tone is within the threshold range of the level of loudness of the second tone; and generating the equalization filter further based in part on the second ECSP and the second voltage.

The level of loudness of the adjusted corresponding tone may represent a level of amplitude of the adjusted corresponding tone perceived by the wearer. Adjusting the corresponding tone may comprise: adjusting an amplitude of the corresponding tone such that the adjusted amplitude is within the threshold range of an amplitude of the first tone. In an embodiment, a method may comprise: generating the equalization filter based in part on a ratio of the voltage to the ECSP.

Generating the equalization filter may comprise: generating a transfer function based in part on the ECSP and the voltage; performing interpolation on the transfer function to generate an interpolated transfer function; performing the Inverse Fourier Transform of the interpolated transfer function to generate a time domain representation of the equalization filter.

In an embodiment, a method may comprise: applying the equalization filter to the audio signal presented to the wearer via the BC transducer by convolving the equalization filter with the audio signal in time domain. In an embodiment, a method may comprise:
measuring, via an accelerometer of the headset, acceleration data associated with vibration of bones in a head of the wearer when presenting the corresponding tone to the wearer via the BC transducer. In an embodiment, a method may comprise: measuring, via a force sensor of the headset, a force applied to bones in a head of the wearer when presenting the corresponding tone to the wearer via the BC transducer. In an embodiment, a method may comprise: measuring, via a binaural microphone, a sound pressure in an ear canal of the wearer when presenting the corresponding tone to the wearer via the BC transducer.

In an embodiment, a method may comprise: presenting, via the BC transducer, an audio signal to the wearer; monitoring sensor data related to at least one variable related to an ear of the wearer measured upon presenting the audio signal to the wearer via the BC transducer; and dynamically adjusting the audio signal provided to the wearer via the BC transducer so that the monitored sensor data is within a threshold from an equalization data for the BC transducer. In an embodiment, a method may comprise: retrieving the equalization data for the BC transducer from a memory of the headset.

In an embodiment, a headset may comprise: an air conduction (AC) transducer configured to present a first tone to a wearer of the headset, the first tone of a plurality of tones that are at different frequencies; an acoustic sensor configured to record an ear-canal sound pressure (ECSP) resulting from the first tone; a bone conduction (BC) transducer configured to present a corresponding tone to the wearer, the corresponding tone having a same frequency as the first tone; and a controller configured to: adjust the corresponding tone such that a level of loudness is within a threshold range of a level of loudness of the first tone, record a voltage applied to the BC transducer for generating the adjusted corresponding tone such that the level of loudness of the adjusted corresponding tone is within the threshold range of the level of loudness of the first tone, and generate an equalization filter based in part on the ECSP and the voltage, the equalization filter for filtering an audio signal for presentation via the BC transducer.

The AC transducer may be configured to present a second tone to the wearer, the second tone of the plurality of tones that is at a second frequency different than the frequency of the first tone; the acoustic sensor may be configured to record a second ECSP resulting from the second tone; the BC transducer may be configured to present a corresponding second tone to the wearer, the corresponding second tone having a same frequency as the second tone; and the controller may be configured to: adjust the second corresponding tone such that a level of loudness is within the threshold range of the level of loudness of the second tone, record a second voltage applied to the BC transducer for generating the adjusted second corresponding tone such that the level of loudness of the adjusted second corresponding tone is within the threshold range of the level of loudness of the second tone, and generate the equalization filter further based in part on the second EC SP and the second voltage.

The BC transducer may be configured to present the corresponding tone to each wearer in a set of wearers, and the headset may comprise: a sensor configured to measure at least one variable related to an ear of each wearer in the set upon presenting the corresponding tone to each wearer via the BC transducer, wherein the controller is further configured to: generate equalization data for each wearer in the set based in part on the at least one variable, and generate equalization data for the BC transducer based on the equalization data for the wearers in the set.

In an embodiment, a headset may comprise: a memory configured to store the equalization data for the BC transducer. The sensor may include an accelerometer configured to: measure acceleration data associated with vibration of bones in a head of that wearer when presenting the corresponding tone to that wearer via the BC transducer. The sensor may include a force sensor configured to: measure a force applied to bones in a head of that wearer when presenting the corresponding tone to that wearer via the BC transducer. The sensor may include a binaural microphone configured to: measure a sound pressure in an ear canal of that wearer when presenting the corresponding tone to that wearer via the BC transducer.

The BC transducer may be configured to present an audio signal to the wearer, and the headset may comprise: a sensor configured to monitor sensor data related to at least one variable related to an ear of the wearer measured upon presenting the audio signal to the wearer via the BC transducer, wherein the controller is further configured to dynamically adjust the audio signal provided to the wearer via the BC transducer so that the monitored sensor data is within a threshold from an equalization data for the BC transducer.

In an embodiment, one or more computer-readable non-transitory storage media may embody software that is operable when executed to perform a method or in a headset or system or any of the above mentioned embodiments. In an embodiment, a system may comprise: one or more processors; and at least one memory coupled to the processors and comprising instructions executable by the processors, the processors operable when executing the instructions to perform a method or in a headset or system or any of the above mentioned embodiments. In an embodiment, a computer program product, preferably comprising a computer-readable non-transitory storage media, may be operable when executed on a data processing system to perform a method or in a headset or system or any of the above mentioned embodiments.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method comprising:
   presenting, via an air conduction (AC) transducer to a wearer of a headset, a plurality of tones that are at different frequencies;
   presenting, via a bone conduction (BC) transducer of the headset to the wearer, each tone corresponding to each of the plurality of tones, the each corresponding tone having a same frequency as each of the plurality of tones;
   adjusting the each corresponding tone such that a level of loudness of the each corresponding tone is within a threshold range of a level of loudness of each of the plurality of tones;
   recording a plurality of ear-canal sound pressures (ECSPs) resulting from the plurality of tones;
   recording each voltage of a plurality of voltages applied to the BC transducer for generating each adjusted corresponding tone such that the level of loudness of the each adjusted corresponding tone is within the threshold range of the level of loudness of each of the plurality of tones;
   while presenting the plurality of tones, generating an equalization filter based on the ECSPs and the voltages;
   after the plurality of tones are presented, measuring, via an accelerometer coupled to the BC transducer, acceleration data while presenting an audio signal via the BC transducer; and
   adjusting the audio signal for presentation via the BC transducer based on the acceleration data and an equalization curve of the generated equalization filter.

2. The method of claim 1, wherein the level of loudness of the each adjusted corresponding tone represents a level of amplitude of the each adjusted corresponding tone perceived by the wearer.

3. The method of claim 1, wherein adjusting the each corresponding tone comprises:
   adjusting an amplitude of the each corresponding tone such that the adjusted amplitude is within the threshold range of an amplitude of each of the plurality of tones.

4. The method of claim 1, further comprising:
   generating the equalization filter based on a ratio of the voltages to the ECSPs.

5. The method of claim 1, wherein generating the equalization filter comprises:
   generating a transfer function based on the ECSPs and the voltages;
   performing interpolation on the transfer function to generate an interpolated transfer function; and
   performing the Inverse Fourier Transform of the interpolated transfer function to generate a time domain representation of the equalization filter.

6. The method of claim 1, further comprising:
   applying the equalization filter to the audio signal presented to the wearer via the BC transducer by convolving the equalization filter with the audio signal in time domain.

7. The method of claim 1, further comprising:
   measuring, via the accelerometer, acceleration data associated with vibration of bones in a head of the wearer when presenting the each corresponding tone to the wearer via the BC transducer.

8. The method of claim 1, further comprising:
   measuring, via a force sensor of the headset, a force applied to bones in a head of the wearer when presenting the each corresponding tone to the wearer via the BC transducer.

9. The method of claim 1, further comprising:
   measuring, via a binaural microphone, a sound pressure in an ear canal of the wearer when presenting the each corresponding tone to the wearer via the BC transducer.

10. The method of claim 1, further comprising:
    presenting, via the BC transducer, audio content to the wearer;
    monitoring sensor data related to at least one variable related to an ear of the wearer measured upon presenting the audio content to the wearer via the BC transducer; and
    dynamically adjusting the audio content provided to the wearer via the BC transducer so that the monitored sensor data is within a threshold from an equalization data for the BC transducer.

11. The method of claim 10, further comprising:
    retrieving the equalization data for the BC transducer from a memory of the headset.

12. A headset comprising:
an air conduction (AC) transducer configured to present to a wearer of the headset, a plurality of tones that are at different frequencies;
an acoustic sensor configured to record a plurality of ear-canal sound pressures (ECSPs) resulting from the plurality of tones;
a bone conduction (BC) transducer configured to present to the wearer each tone corresponding to each of the plurality of tones, the each corresponding tone having a same frequency as each of the plurality of tones;
a controller configured to:
    adjust the each corresponding tone such that a level of loudness of the each corresponding tone is within a threshold range of a level of loudness of each of the plurality of tones,
    record each voltage of a plurality of voltages applied to the BC transducer for generating each adjusted corresponding tone such that the level of loudness of the each adjusted corresponding tone is within the threshold range of the level of loudness of each of the plurality of tones, and
    while presenting the plurality of tones, generate an equalization filter based on the ECSPs and the voltages; and
an accelerometer coupled to the BC transducer, the accelerometer configured to measure, after the plurality of tones are presented, acceleration data while presenting an audio signal via the BC transducer, and
the controller is further configured to adjust the audio signal for presentation via the BC transducer based on the acceleration data and an equalization curve of the generated equalization filter.

13. The headset of claim 12, wherein the BC transducer is further configured to present the each corresponding tone to each wearer in a set of wearers, and the headset further comprising:
a sensor configured to measure at least one variable related to an ear of each wearer in the set upon presenting the each corresponding tone to each wearer via the BC transducer, wherein the controller is further configured to:
    generate equalization data for each wearer in the set based in part on the at least one variable, and
    generate equalization data for the BC transducer based on the equalization data for the wearers in the set.

14. The headset of claim 13, further comprising:
a memory configured to store the equalization data for the BC transducer.

15. The headset of claim 12, wherein the accelerometer is configured to:
measure acceleration data associated with vibration of bones in a head of each wearer in a set when presenting the each corresponding tone to each wearer via the BC transducer.

16. The headset of claim 12, wherein a force sensor coupled to the BC transducer is configured to:
measure a force applied to bones in a head of each wearer in a set when presenting the each corresponding tone to each wearer via the BC transducer.

17. The headset of claim 12, wherein a binaural microphone coupled to the BC transducer is configured to:
measure a sound pressure in an ear canal of each wearer in a set when presenting the each corresponding tone to each wearer via the BC transducer.

18. The headset of claim 12, wherein the BC transducer is further configured to present audio content to the wearer, and the headset further comprising:
a sensor configured to monitor sensor data related to at least one variable related to an ear of the wearer measured upon presenting the audio content to the wearer via the BC transducer, wherein
the controller is further configured to dynamically adjust the audio content provided to the wearer via the BC transducer so that the monitored sensor data is within a threshold from an equalization data for the BC transducer.

* * * * *